(12) United States Patent
Wang et al.

(10) Patent No.: US 10,947,620 B2
(45) Date of Patent: Mar. 16, 2021

(54) MASK PLATE AND MANUFACTURE METHOD THEREOF

(71) Applicants: BOE Technology Group Co., Ltd., Beijing (CN); Chengdu BOE Optoelectronics Technology Co., Ltd., Chengdu (CN)

(72) Inventors: Wei Wang, Beijing (CN); Zhifeng Zhan, Beijing (CN); Yanxin Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 16/196,116

(22) Filed: Nov. 20, 2018

(65) Prior Publication Data
US 2019/0242012 A1 Aug. 8, 2019

(30) Foreign Application Priority Data

Feb. 5, 2018 (CN) .......................... 201810110963.5

(51) Int. Cl.
*C23C 16/04* (2006.01)
*B05C 21/00* (2006.01)
(52) U.S. Cl.
CPC .......... *C23C 16/042* (2013.01); *B05C 21/005* (2013.01)

(58) Field of Classification Search
None
See application file for complete search history.

(56) References Cited

U.S. PATENT DOCUMENTS

2017/0092862 A1* 3/2017 Obata ...................... B05D 1/32
2019/0100834 A1* 4/2019 Sakio ...................... C23C 14/24

FOREIGN PATENT DOCUMENTS

WO    WO 2017/163443 A1 * 9/2017 ........... C23C 14/042

* cited by examiner

*Primary Examiner* — Jethro M. Pence
(74) *Attorney, Agent, or Firm* — Nath, Goldberg & Meyer; Joshua B. Goldberg (57) ABSTRACT

The present disclosure provides a mask plate and a manufacture method thereof, the mask plate including: a mask body, which is provided with an opening penetrating through a thickness of the mask body; a special-shaped portion configured to be disposed at an edge of the opening and protrudes toward a center of the opening, and configured to be formed by the mask body; and at least one deformation adjustment layer disposed on the mask body or in the mask body, an orthographic projection of the at least one deformation adjustment layer on a plane in which a first surface of the mask body is located at least partially overlaps with an orthographic projection of the special-shaped portion on the plane in which the first surface of the mask body is located, wherein a thermal expansion coefficient of the deformation adjustment layer is different from that of the special-shaped portion.

20 Claims, 9 Drawing Sheets

Fig.1
-Prior Art-

Original position

MASK PLATE AND MANUFACTURE METHOD THEREOF

CROSS-REFERENCE TO RELATED APPLICATION

This application claims the benefit of priority to Chinese Patent Application No. 201810110963.5 filed on Feb. 5, 2018, the contents of which are incorporated herein in their entirety by reference.

TECHNICAL FIELD

The present disclosure relates to the field of display technology, and in particular relates to a mask plate and a manufacture method thereof.

BACKGROUND

With the introduction of full-screens and special-shaped screens into the market, the problems of packaging of the special-shaped screens have gradually emerged. One of the problems encountered at present is in that: in a case where a chemical vapor deposition (hereinafter referred to as CVD) process is performed by using a special-shaped mask plate, after manufacturing several film layers, the special-shaped mask plate may be deformed and warped due to a stress of the film layers, resulting in deformation of a special-shaped portion of the special-shaped mask plate when depositing the film layers.

SUMMARY

The present disclosure provides a mask plate including:

a mask body, which is provided with an opening penetrating through a thickness of the mask body;

a special-shaped portion configured to be disposed at an edge of the opening and protrudes toward a center of the opening, and configured to be formed by the mask body; and at least one deformation adjustment layer disposed on the mask body or in the mask body, an orthographic projection of the at least one deformation adjustment layer on a plane in which a first surface of the mask body is located at least partially overlapping with an orthographic projection of the special-shaped portion on the plane in which the first surface of the mask body is located, wherein a thermal expansion coefficient of the deformation adjustment layer is different from that of the special-shaped portion According to an embodiment of the present disclosure, the mask body further has a second surface opposite to the first surface, and the deformation adjustment layer is disposed close to the second surface rather than the first surface of the mask body.

According to an embodiment of the present disclosure, the first surface of the mask body is a surface of the mask body on which a deposited film layer is deposited, in a case where a film stress of the deposited film layer is represented as a tensile stress, the thermal expansion coefficient of the deformation adjustment layer is set to be greater than that of the special-shaped portion, and in a case where the film stress of the deposited film layer is represented as a compressive stress, the thermal expansion coefficient of the deformation adjustment layer is set to be smaller than that of the special-shaped portion.

According to an embodiment of the present disclosure, the first surface of the mask body is a surface opposite to a surface of the mask body on which a deposited film layer is deposited, in a case where a film stress of the deposited film layer is represented as a compressive stress, the thermal expansion coefficient of the deformation adjustment layer is set to be greater than that of the special-shaped portion, and in a case where the film stress of the deposited film material is represented as a tensile stress, the thermal expansion coefficient of the deformation adjustment layer is set to be smaller than that of the special-shaped portion.

According to an embodiment of the present disclosure, the deformation adjustment layer is disposed in the special-shaped portion, a first surface of the deformation adjustment layer is coplanar with the first surface of the mask body, and a second surface of the deformation adjustment layer opposite to the first surface thereof is disposed between the first surface of the mask body and the second surface of the mask body.

According to an embodiment of the present disclosure, the deformation adjustment layer is disposed in the special-shaped portion, a first surface of the deformation adjustment layer is disposed between the first surface of the mask body and the second surface of the mask body, and a second surface of the deformation adjustment layer protrudes from the second surface of the mask body.

According to an embodiment of the present disclosure, the deformation adjustment layer is completely disposed in the special-shaped portion, a first surface of the deformation adjustment layer and a second surface of the deformation adjustment layer are not exposed from the mask body, and the deformation adjustment is disposed close to the first surface of the mask body rather than the second surface of the mask body.

According to an embodiment of the present disclosure, the deformation adjustment layer is completely disposed in the special-shaped portion, a first surface of the deformation adjustment layer and a second surface of the deformation adjustment layer are not exposed from the mask body, and the deformation adjustment is disposed close to the second surface of the mask body rather than the first surface of the mask body.

According to an embodiment of the present disclosure, the deformation adjustment layer has a uniform thickness.

According to an embodiment of the present disclosure, the deformation adjustment layer has a varying thickness, and thicknesses of parts of the deformation adjustment layer are associated with deformation amounts of corresponding parts of the special-shaped portion.

According to an embodiment of the present disclosure, a length of the orthographic projection of the deformation adjustment layer on the first surface of the mask body, in a direction perpendicular to a protruding direction of the special-shaped portion, is gradually increasing along the protruding direction of the special-shaped portion.

According to an embodiment of the present disclosure, the orthographic projection of the deformation adjustment layer on the first surface of the mask body has a shape of an isosceles triangle or an isosceles trapezoid.

According to an embodiment of the present disclosure, the number of the deformation adjustment layer is plural, the plurality of the deformation adjustment layers are spaced apart in a direction perpendicular to the protruding direction of the special-shaped portion.

According to an embodiment of the present disclosure, the number of the deformation adjustment layer is plural, an orthographic projection of each of the plurality of deformation adjustment layers on a plane in which the first surface of the mask body is located has a shape of a linear strip extending in a direction perpendicular to a protruding direction of the special-shaped portion, the plurality of deformation adjustment layers are spaced apart in the protruding direction of the special-shaped portion, and widths of the plurality of the deformation adjustment layers in the protruding direction of the special-shaped portion, are gradually increasing along the protruding direction of the special-shaped portion.

According to an embodiment of the present disclosure, the orthographic projection of the deformation adjustment layer on the plane in which the first surface of the mask body is located also covers a region nearby a common boundary of the special-shaped portion and the mask body.

According to an embodiment of the present disclosure, the deformation adjustment layer includes a first portion and a second portion that are separated from each other, wherein an orthographic projection of the first portion of the deformation adjustment layer on the first surface of the mask body at least partially overlaps with the orthographic projection of the special-shaped portion on the first surface of the mask body, an orthographic projection of the second portion of the deformation adjustment layer on the first surface of the mask body overlaps the region nearby a common boundary of the special-shaped portion and the mask body.

The present disclosure further provides a manufacture method of a mask plate, wherein the mask plate is the mask plate according to an embodiment of the present disclosure, the method including:

preparing a mask body;

forming an opening penetrating through a thickness of the mask body in the mask body, and a special-shaped portion protruding toward a center of the opening is formed by the mask body at an edge of the opening;

forming at least one deformation adjustment layer on the mask body or in the mask body, an orthographic projection of the at least one deformation adjustment layer on a plane in which a first surface of the mask body is located at least partially overlapping with an orthographic projection of the special-shaped portion on the plane in which the first surface of the mask body is located, wherein a thermal expansion coefficient of the deformation adjustment layer is different from that of the special-shaped portion

DETAILED DESCRIPTION

In order to provide a better understanding of the technical solutions of the present disclosure to those skilled in the art, the present disclosure is described in detail below in conjunction with the drawings and specific implementations.

Figure 1:
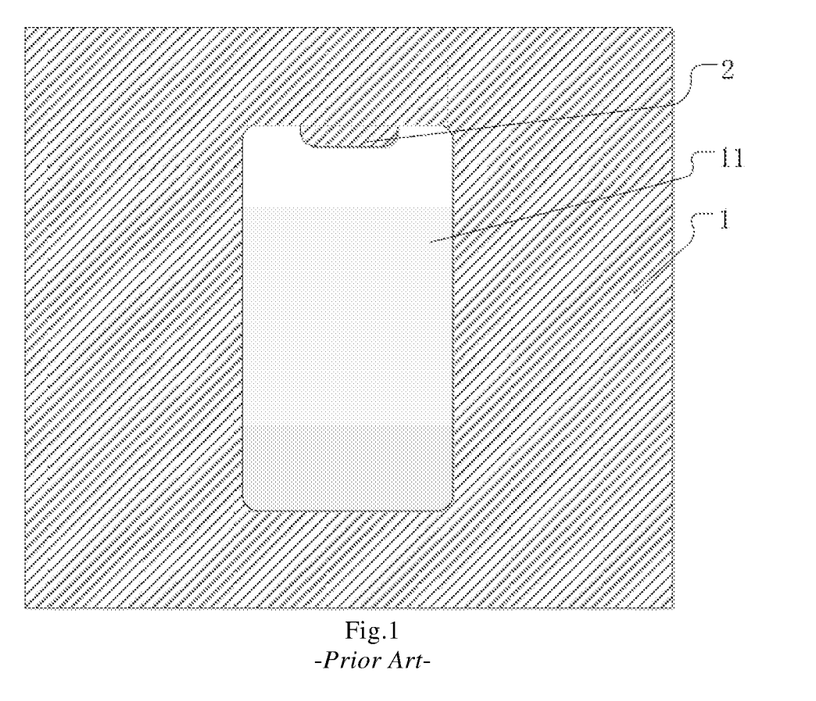
FIG. 1 is a structural diagram of a special-shaped mask plate in the related art.
Figure 2:
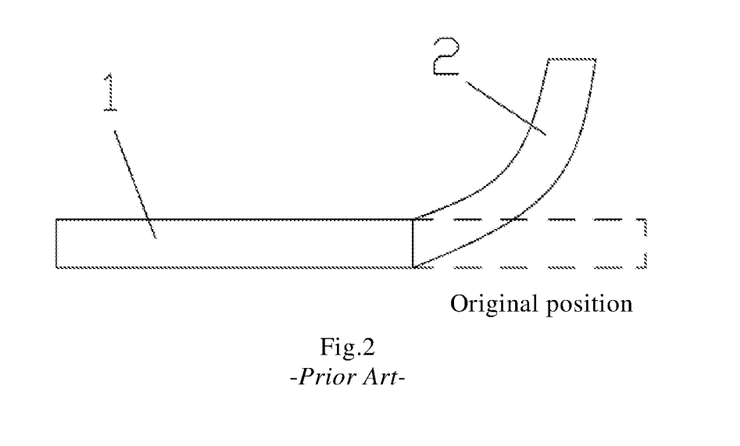
FIG. 2 is a schematic diagram showing deforming and warping of a special-shaped portion.

FIG. 1 is a structural diagram of a special-shaped mask plate in the related art. As shown in FIG. 1, the special-shaped mask plate includes a mask body 1 provided with an opening 11 in a through-thickness direction of the mask body 1. The mask body 1 has a special-shaped portion 2, which is disposed at an edge of the opening 11 and protrudes toward a center of the opening 11. After the a plurality of film layers is formed by using the special-shaped mask plate, as shown in FIG. 2, the special-shaped portion 2 is tend to deformation such as warpage and elongation.

Figure 3A:
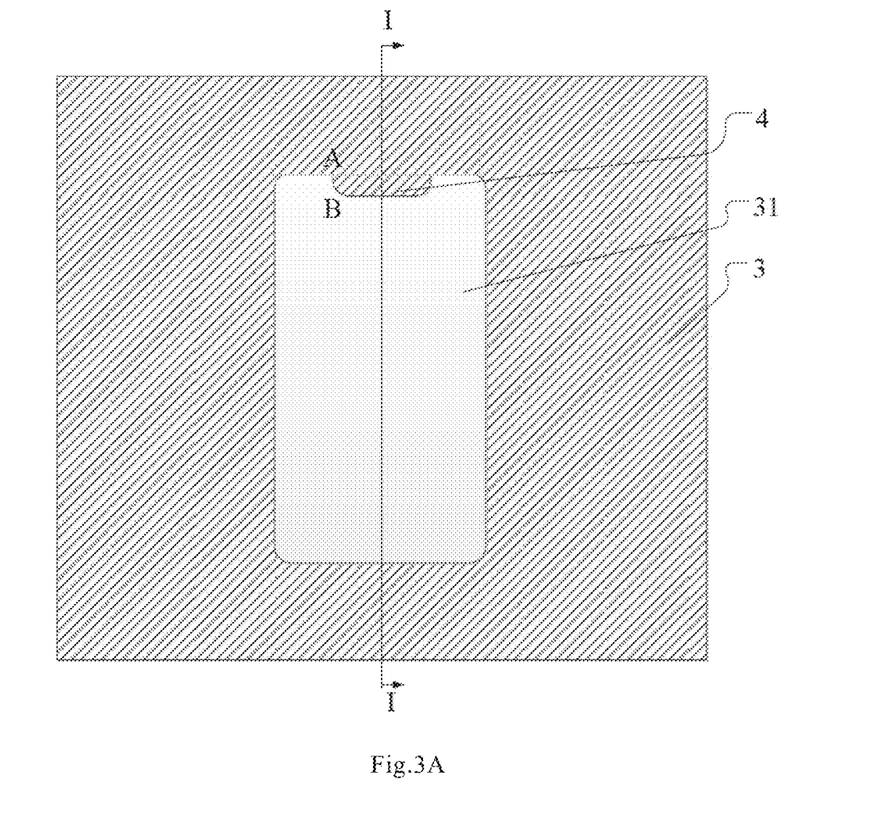
FIG. 3A is a structural diagram of a mask plate according to an embodiment of the present disclosure.
Figure 3B:
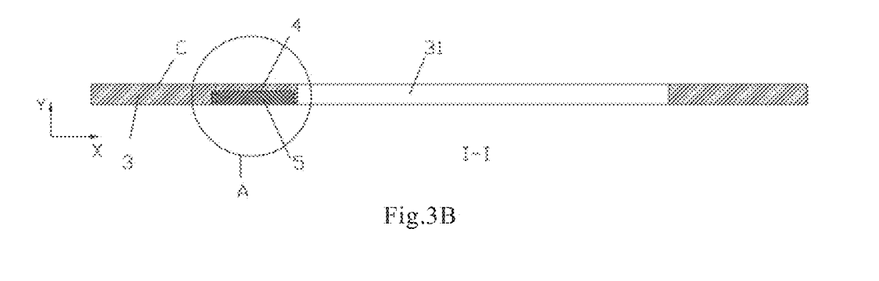
FIG. 3B is a cross-sectional view of the mask plate taken along line I-I of FIG. 3A.
Figure 4A:
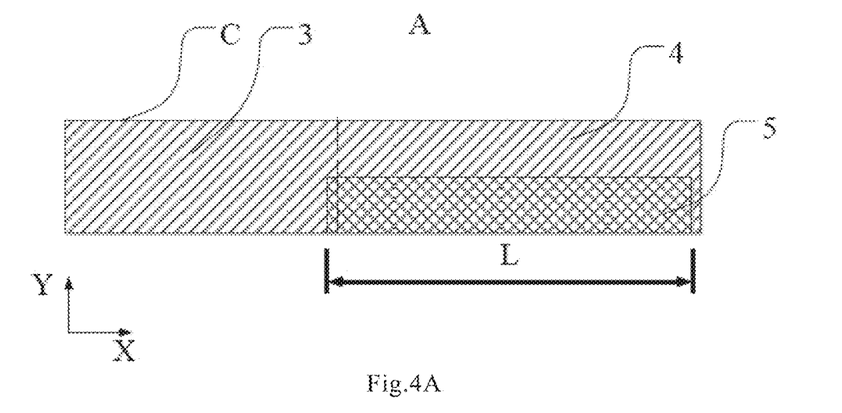
FIG. 4A is a longitudinal cross-sectional view of an area A in FIG. 3B.
Figure 4B:
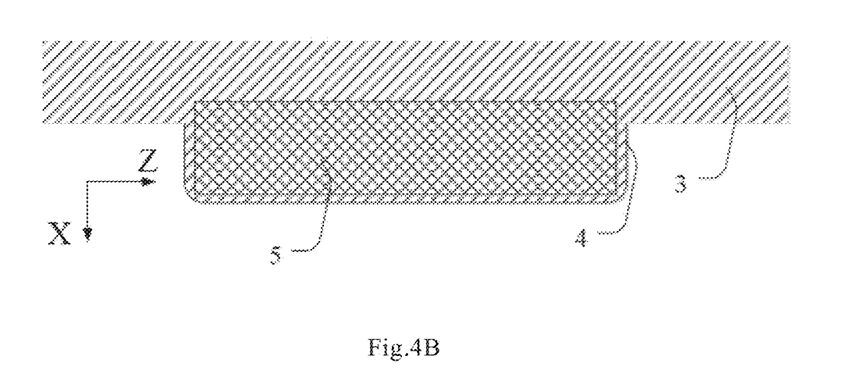
FIG. 4B is a transverse cross-sectional view of an area A in FIG. 3B.

To this end, referring to FIG. 3 through FIG. 4B, a mask plate provided in an embodiment of the present disclosure includes a mask body 3, an opening 31 is provided in the mask body 3 in a through-thickness direction of the mask body 3, the mask body 3 has a special-shaped portion 4 disposed on an edge of the opening 31 and protruding toward a center of the opening 31 (i.e., along the X direction of FIG. 3B). That is to say, the mask body 3 may include the special-shaped portion 4. In addition, the mask plate further includes a deformation adjustment layer 5, and an orthographic projection of the deformation adjustment layer 5 on a plane where a deposition surface C of the mask body 3 is located at least partially overlaps with an orthographic projection of the special-shaped portion 4 on the plane where the deposition surface C of the mask body 3 is located. The deposition surface C of the mask body 3 refers to a surface on which film layers are deposited during a deposition process. In addition, a thermal expansion coefficient of the deformation adjustment layer 5 is different from that of the special-shaped portion 4 to suppress deformation of the special-shaped portion 4 during the deposition process.

Since there is a difference in the thermal expansion coefficient between the deformation adjustment layer 5 and the special-shaped portion 4, a force applied by the deformation adjustment layer 5 to the special-shaped portion 4 is contrary to that applied by a film layer, which is deposited on a surface of the special-shaped portion 4 at a same side as the deposition surface C during the deposition process, to the special-shaped portion 4, so that deformation, such as warpage and elongation, of the special-shaped portion 4 can be suppressed, and deposition accuracy can be improved.

In the present embodiment, the number of the deformation adjustment layer 5 is one. As shown in FIG. 4A, the deformation adjustment layer 5 is disposed in the mask body 3, and one of surfaces of the deformation adjustment layer 5 is coplanar with one of surfaces of the mask body 3. Optionally, as shown in FIG. 4B, at least a part of the orthographic projection of the deformation adjustment layer 5 on the plane where the deposition surface C of the mask body 3 is located overlaps with the orthographic projection of the special-shaped portion 4 on the plane where the deposition surface C of the mask body 3 is located, so that the force applied to the special-shaped portion 4 may be more uniformly. Further, the deformation adjustment layer 5 has a constant width in the X direction; and the deformation adjustment layer 5 has a constant length in the Z direction (that is, the deformation adjustment layer 5 may be a rectangular parallelepiped).

In a case where a film stress of the deposited film material is represented as a compressive stress, the film material expands along the surface of the film material, and at this time, the special-shaped portion 4 bears a force that makes the special-shaped portion 4 bent and deformed in a direction opposite to the Y direction of FIG. 4A. In this case, the thermal expansion coefficient of the deformation adjustment layer 5 may be set to be larger than that of the special-shaped portion 4. Since the deformation adjustment layer 5 has a tendency to be elongated and deformed in the X direction of FIG. 4A due to thermal expansion during processing, and the degree of deformation of the deformation adjustment layer 5 is greater than that of the special-shaped portion 4, which causes the deformation adjustment layer 5 to apply a force for bending the special-shaped portion 4 in the Y direction of FIG. 4A. Therefore at least a part of the film stress borne by the special-shaped portion 4 may be eliminated, and deformation, such as warpage and elongation, of the special-shaped portion 4 can be prevented from occurring Conversely, in a case where a film stress of the deposited film material is represented as a tensile stress, the film material shrinks along the surface of the film material, and at this time, the special-shaped portion 4 bears a force that makes the special-shaped portion 4 bent and deformed in the Y direction of FIG. 4A. In this case, the thermal expansion coefficient of the deformation adjustment layer 5 may be set to be smaller than that of the special-shaped portion 4. Since the deformation adjustment layer 5 has a tendency to be elongated and deformed in the X direction of FIG. 4A due to thermal expansion during processing, and the degree of deformation is smaller than that of the special-shaped portion 4, which causes the deformation adjustment layer 5 to apply a force for bending the special-shaped portion 4 in a direction opposite to the Y direction of FIG. 4A. Therefore at least a part of the film stress borne by the special-shaped portion 4 may be eliminated, and the deformation, such as warpage and elongation, of the special-shaped portion 4 can be prevented from occurring.

In practical applications, magnitude and/or position of the force applied by the deformation adjustment layer 5 to the special-shaped portion 4 may be adjusted by setting parameters, such as material, shape, size, and/or position, of the deformation adjustment layer 5, so as to limit the force to a certain range.

In practical applications, in the field of packaging, the mask plate 3 is usually made of invar, which is an iron alloy containing 35.4% nickel and has a thermal expansion coefficient of $1.6 \times 1E^{-6}/°$ C. at normal temperature. The mask plate 3 has a thickness ranging from about 10 μm to about 50 μm. The film material to be deposited is usually made of an inorganic material such as $Al_2O_3$, SiN, SiNO, $SiO_2$ or the like. Appropriate material of the deformation adjustment layer 5 may be selected according to the structure and property of the film layer and the process parameters, so that the force applied by the deformation adjustment layer 5 to the special-shaped portion 4 may have a same magnitude as that of the film stress borne by the deformed portion 4 and opposite direction opposite to that of the film stress borne by the deformed portion 4.

It should be noted that, in practical applications, a length L of the deformation adjustment layer 5 in the protruding direction of the special-shaped portion 4 (i.e., the X direction of FIG. 4A), and/or a thickness (i.e., size in the Y direction of FIG. 4A) of the deformation adjustment layer 5 may be set according to the distribution of deformation amount of the special-shaped portion 4. In addition, the deformation adjustment layer 5 may also extend to a region close to a common boundary (shown as a broken line in FIG. 4A) of the mask body 3 and the special-shaped portion 4 to suppress the deformation generated in the region. That is, the orthographic projection of the deformation adjustment layer 5 on the deposition surface C of the mask body 3 may fall within the orthographic projection of the special-shaped portion 4 on the deposition surface C of the mask body 3. Alternatively, the deformation adjustment layer 5 includes a first portion and a second portion, which form an integrated structure or are separated from each other, an orthographic projection of the first portion of the deformation adjustment layer 5 on the deposition surface C of the mask body 3 overlaps with the orthographic projection of the special-shaped portion 4 on the deposition surface C of the mask body 3, and an orthographic projection of the second portion of the deformation adjustment layer 5 on the deposition surface C of the mask body 3 overlaps with an orthographic projection of the region nearby the common boundary of the special-shaped portion 4 and the mask body 3 on the deposition surface C of the mask body 3.

It should be noted that, in the embodiment, the number of the deformation adjustment layer 5 is one, but the disclosure is not limited thereto. In practical applications, the number of the deformation adjustment layer may also be plural.

Figure 5A:
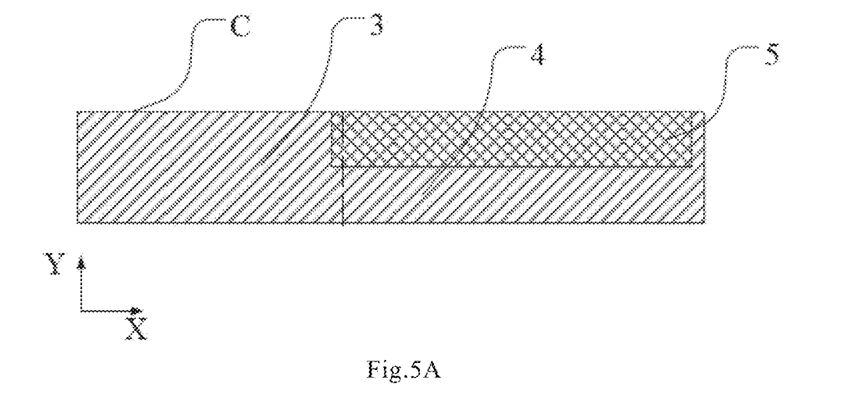
FIGS. 5A-5D are longitudinal cross-sectional views of a part of a mask plate according to a variant of an embodiment of the present disclosure.

As a variant of the present embodiment, as shown in. FIG. 5A, the number of the deformation adjustment layer 5 is one, the deformation adjustment layer 5 is disposed in the mask body 3, an upper surface of the deformation adjustment layer 5 (for example, a first surface) is coplanar with the deposition surface C, and the deformation adjustment layer 5 has an uniform thickness.

In a case where a film stress of the deposited film material is represented as a tensile stress, the film material shrinks along the surface of the film material, and at this time, the special-shaped portion 4 bears a force that makes the special-shaped portion 4 bent and deformed in the Y direction of FIG. 5A. In this case, the thermal expansion coefficient of the deformation adjustment layer 5 may be set to be larger than that of the special-shaped portion 4. In this way, since the deformation adjustment layer 5 has a tendency to be elongated and deformed in the X direction of FIG. 5A due to thermal expansion during processing, and the degree of deformation of the deformation adjustment layer 5 is greater than that of the special-shaped portion 4, which causes the deformation adjustment layer 5 to apply a force for bending the special-shaped portion 4 in a direction opposite to the Y direction of FIG. 5A. Therefore at least a part of the film stress borne by the special-shaped portion 4 may be eliminated, and deformation, such as warpage and elongation, of the special-shaped portion 4 can be prevented from occurring.

Conversely, in a case where a film stress of the deposited film material is represented as a compressive stress, the film material expands along the surface of the film material, and at this time, the special-shaped portion 4 bears a force that makes the special-shaped portion 4 bent and deformed in a direction opposite to the Y direction of FIG. 5A. In this case, the thermal expansion coefficient of the deformation adjustment layer 5 may be set to be smaller than that of the special-shaped portion 4. In this way, since the deformation adjustment layer 5 has a tendency to be elongated and deformed in the X direction of FIG. 5A due to thermal expansion during the process, and the degree of deformation of the deformation adjustment layer 5 is smaller than that of the special-shaped portion 4, which causes the deformation adjustment layer 5 to apply a force for bending the special-shaped portion 4 in the Y direction of FIG. 5A. Therefore at least a part of the film stress borne by the special-shaped portion 4 may be eliminated, and deformation, such as warpage and elongation, of the special-shaped portion 4 can be prevented from occurring.

Figure 5B:
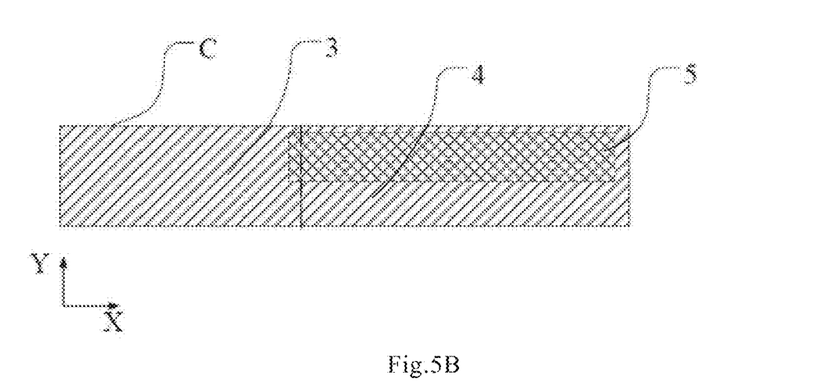
Figure 5C:
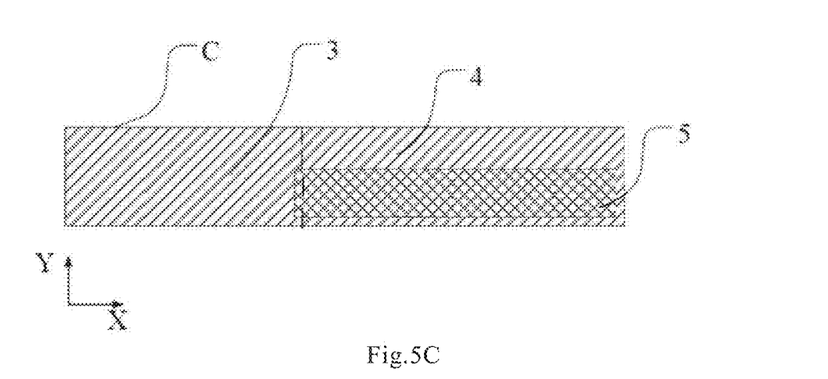
Figure 5D:
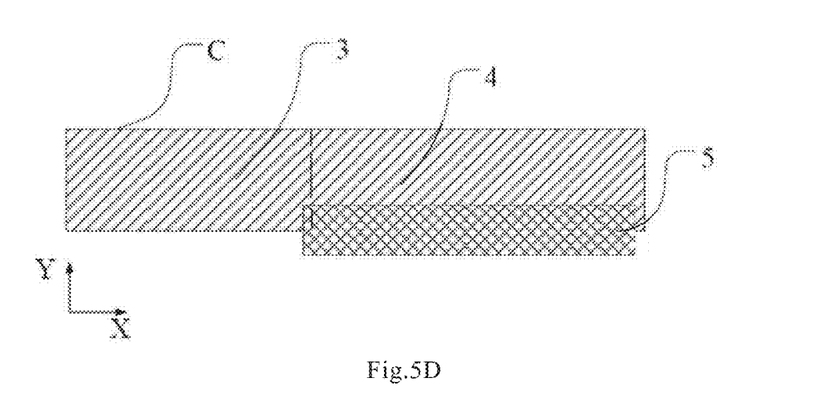

Alternatively, for example, as shown in FIGS. 5B through 5D, the deformation adjustment layer 5 may be disposed at various positions in the through-thickness direction of the mask plate. For example, the thermal expansion coefficient of the deformation adjustment layer 5 of FIG. 5B may be set in the same manner as FIG. 5A. The thermal expansion coefficients of the deformation adjustment layers 5 of FIGS. 5C and 5D may be set in the same manner as FIG. 4A.

Figure 6:
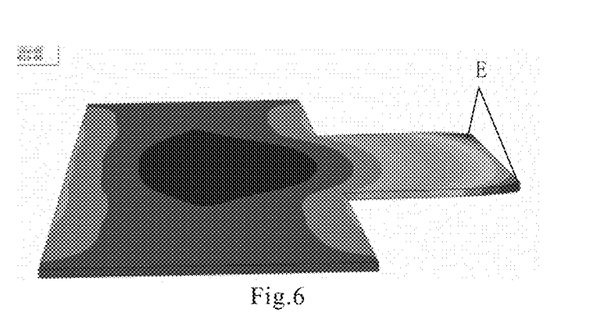
FIG. 6 is schematic diagram showing a distribution of deformation amounts of a part of a mask plate.
Figure 7A:
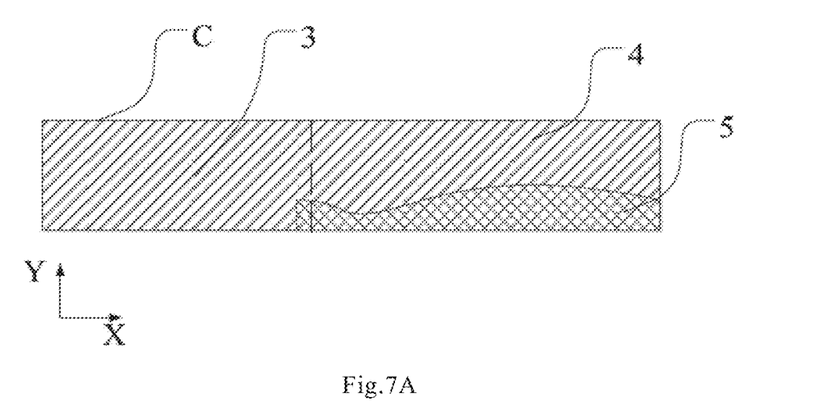
FIG. 7A is a longitudinal cross-sectional view of a part of a mask plate according to another embodiment of the present disclosure.
Figure 7B:
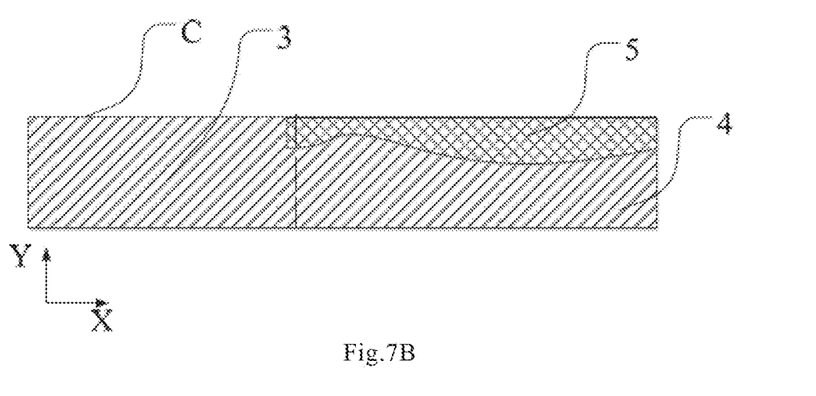
FIG. 7B is a longitudinal cross-sectional view of a part of a mask plate according to a variant of another embodiment of the present disclosure.

Referring to FIG. 6 through FIG. 7B, a mask plate provided by another embodiment of the present disclosure is substantially the same as that of the above embodiment, except that the respective parts of the deformation adjustment layer 5 have different thicknesses. Only the differences between the present embodiment and the above-described embodiment will be described in detail below.

Specifically, in the present embodiment, as shown in FIG. 7A, the number of the deformation adjustment layer 5 is one, the deformation adjustment layer 5 is disposed in the mask body 3, and a lower surface (for example, a second surface) of the deformation adjustment layer 5 is coplanar with a second surface of the mask body. Further, respective parts of the deformation adjustment layer 5 have different thicknesses depending on the deformation amount at different parts of the special-shaped portion 4.

Specifically, the magnitude of the force applied by the deformation adjustment layer 5 to the special-shaped portion 4 can be adjusted, by adjusting the thicknesses of the deformation adjustment layer 5. That is, the greater the thickness at a certain position of the deformation adjustment layer 5, the greater the force applied to the special-shaped portion 4; conversely, the smaller the thickness at a certain position of the deformation adjustment layer 5, the smaller the thickness applied to the special-shaped portion 4. For example, FIG. 6 shows a distribution of deformation amount of a mask plate, wherein, the darker the color, the larger the deformation amount. It can be seen that the deformation amount of a region E near two corners of the special-shaped portion 4 is the largest, and the deformation amount of the special-shaped portion 4 varies in the direction F. Thicknesses of respective parts of the deformation adjustment layer 5 are set with reference to variation of the deformation amount of the special-shaped portion 4.

Alternatively, the position of the deformation adjustment layer 5 in FIG. 7A can be set in the manner of FIGS. 5A to 5D.

Other structures of the mask plate provided by the present embodiment of the present disclosure are the same as those of the above embodiment, which have been described in detail in the above, and are not described herein again.

For example, as a variant of the present embodiment, as shown in FIG. 7B, the number of the deformation adjustment layer 5 is one, the deformation adjustment layer 5 is disposed in the mask body 3, an upper surface of the deformation adjustment layer 5 (for example, a first surface) is coplanar with the first surface of the mask body 3. Further, the thicknesses of respective parts of the deformation adjustment layer 5 vary depending on the deformation amount at different parts of the special-shaped portion 4.

Figure 8A:
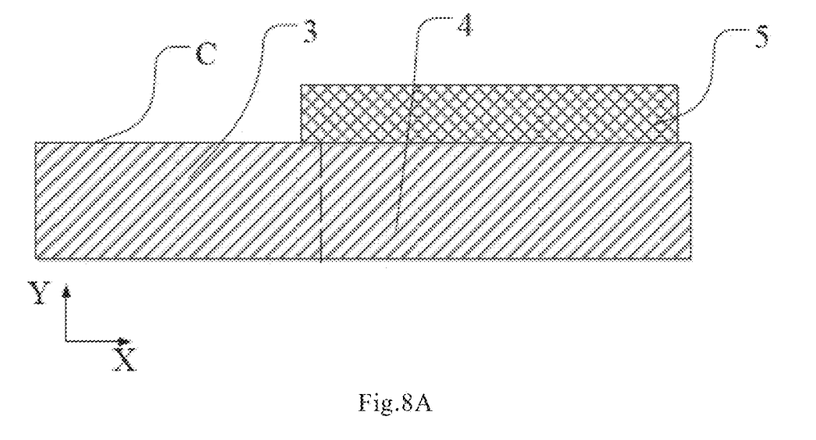
FIG. 8A is a longitudinal cross-sectional view of a part of a mask plate according to yet another embodiment of the present disclosure.

Referring to FIG. 8A, a mask plate according to still another embodiment of the present disclosure is substantially same as that of the embodiment described with reference to FIG. 3A, except that the position of the deformation adjustment layer 5 is different. Only the differences between the present embodiment and the above-described one embodiment will be described in detail below.

Specifically, in the present embodiment, the number of the deformation adjustment layer 5 is one, the deformation adjustment layer 5 is disposed on the special-shaped portion 4 and on a same side as the deposition surface C, and the deformation adjustment layer 5 has a uniform thicknesses. Although the deformation adjustment layer 5 is provided outside the special-shaped portion 4, the deformation adjustment layer 5 also applies a corresponding force to the special-shaped portion 4 when it is thermally expanded, so that deformation, such as warpage and elongation, of the special-shaped portion 4 can be suppressed.

Other structures of the mask plate provided by still another embodiment of the present disclosure are substantially same as those of the embodiment described above with reference to FIG. 3A, which have been described in detail and are not described herein again.

Figure 8B:
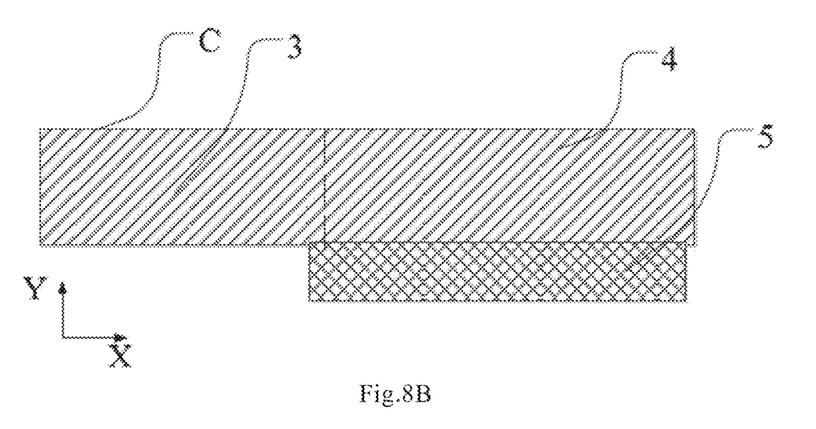
FIG. 8B is a longitudinal cross-sectional view of a part of a mask plate according to a variant of yet another embodiment of the present disclosure.

As a variant of the present embodiment, as shown in FIG. 8B, the deformation adjustment layer 5 is disposed on the special-shaped portion and on a side facing away from the deposition surface C. Also, the deformation adjustment layer 5 has a uniform thickness.

Figure 9A:
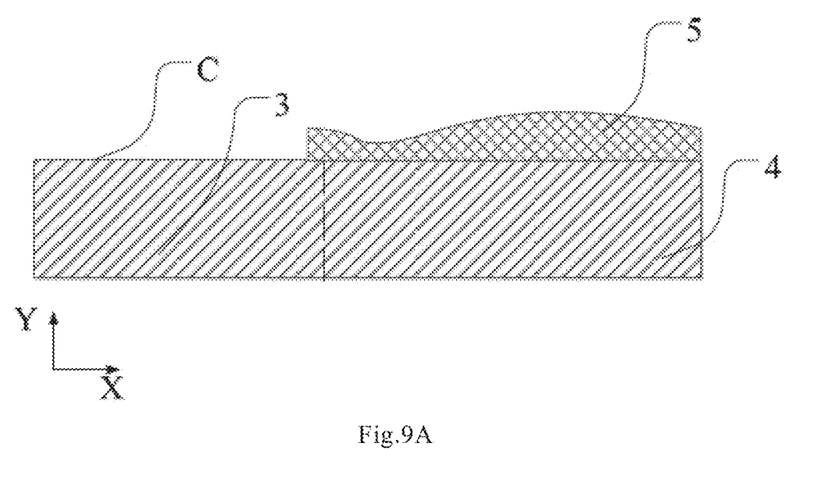
FIG. 9A is a longitudinal cross-sectional view of a part of a mask plate according to still another embodiment of the present disclosure.

Referring to FIG. 9A, a mask plate according to still another embodiment of the present disclosure is substantially the same as that of the embodiment described with reference to FIG. 7A, except that respective parts of the deformation adjustment layer 5 have different thicknesses.

The arrangement with respect to the thickness is the same as those in the embodiment described with reference to FIG. 7A and will not be described herein again.

Figure 9B:
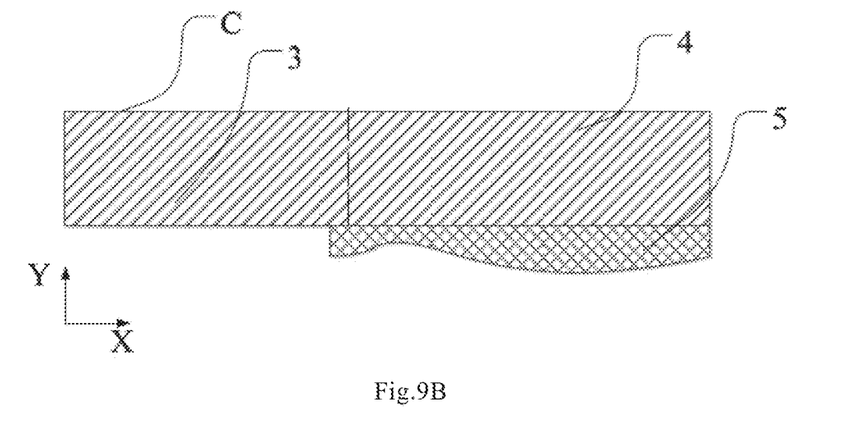
FIG. 9B is a longitudinal cross-sectional view of a part of a mask plate according to a variant of the still another embodiment of the present disclosure.

In the present embodiment, the deformation adjustment layer 5 is disposed on the special-shaped portion 4 and on the same side as the deposition surface C. However, the present disclosure is not limited thereto, and as shown in FIG. 9B, the deformation adjustment layer 5 may also be disposed on the special-shaped portion 4 and on a side facing away from the deposition surface C.

Figure 10A:
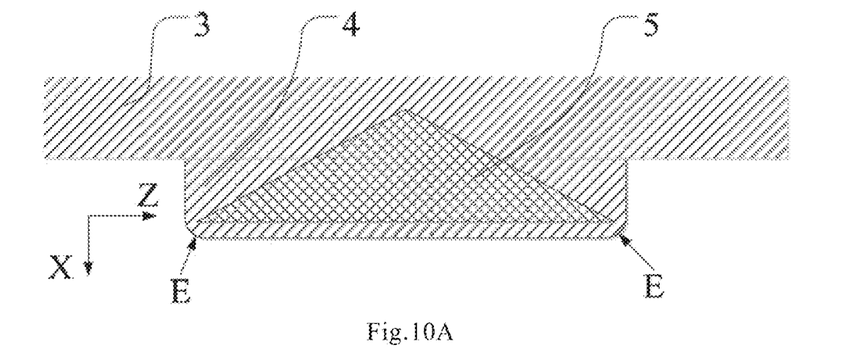
FIG. 10A is a transverse cross-sectional view of a part of a mask plate according to a further another embodiment of the present disclosure.
Figure 10B:
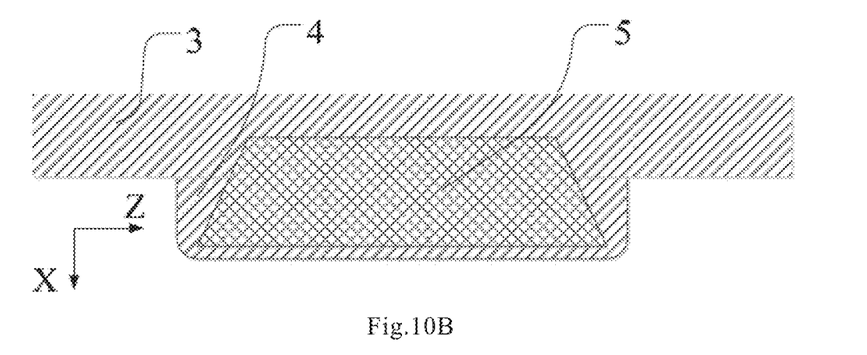
FIG. 10B is a transverse cross-sectional view of a part of a mask plate according to a variant of the further another embodiment of the present disclosure.

Referring to FIG. 10A, a mask plate provided by still another embodiment of the present disclosure is a further variant based on the above embodiments. Specifically, as shown in FIG. 6, the deformation amount of the region E near the two corners of the special-shaped portion 4 is the largest, and the deformation amount of the special-shaped portion 4 is gradually decreasing in the direction F. Since the force applied by the deformation adjustment layer 5 to the special-shaped portion 4 increases with the increasement of an area of the orthographic projection of the deformation adjustment layer 5 on the deposition surface C of the mask body 3, the length of the deformation adjustment layer 5 in a direction (i.e., the Z direction in FIG. 10) perpendicular to the protruding direction (i.e., the X direction in FIG. 10) may be increasing gradually along the protruding direction of the special-shaped portion 4. Therefore, the force applied by the deformation adjustment layer 5 to the special-shaped portion may be increasing gradually along the protruding direction of the special-shaped portion 4, which resulting that different magnitudes of forces can be applied to the special-shaped portion 4 in accordance with the distribution of deformation amount of the special-shaped portion 4. In the present embodiment, the orthographic projection of the deformation adjustment layer 5 on the deposition surface of the mask body 3 has a shape of an isosceles triangle. Certainly, in practical applications, any other shape may be employed as long as different forces can be applied to the special-shaped portion 4. For example, as shown in FIG. 10B, the shape of the orthographic projection of the deformation adjustment layer 5 on the deposition surface of the mask body 3 may also be an isosceles trapezoid.

It will be readily understood that the deformation adjustment layer 5 is in or on the special-shaped 4 on the basis of the present embodiment. Moreover, respective parts of the deformation adjustment layer 5 may have the same thicknesses. Alternatively, the thicknesses of the respective parts of the deformation adjustment layer 5 may be different depending on the deformation amount at the respective parts of the special-shaped portion 4.

Further, the deformation adjustment layer 5 may also extend to a region nearby the common boundary of the mask body 3 and the special-shaped portion 4 to suppress deformation generated in the region.

Figure 11:
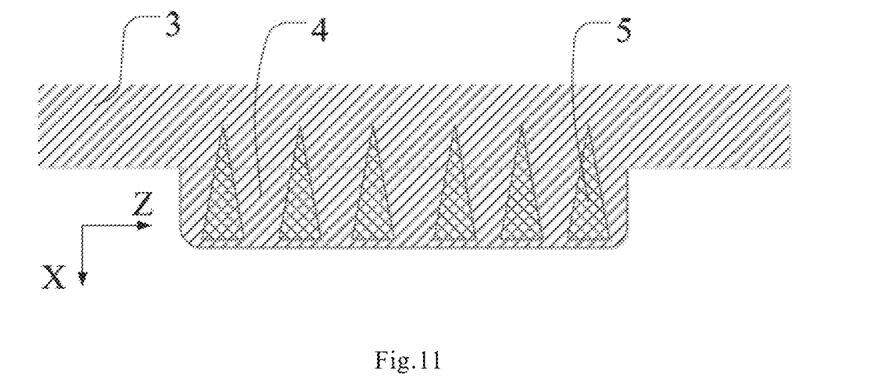
FIG. 11 is a transverse cross-sectional view of a part of a mask plate according to still another embodiment of the present disclosure.

Referring to FIG. 11, a mask plate provided by still another embodiment of the present disclosure is a further variant based on the above embodiments. Specifically, the number of the deformation adjustment layer 5 is plural. The plurality of the deformation adjustment layers 5 are arranged to be spaced apart in a direction (i.e., the X direction of FIG. 11) perpendicular to the protruding direction of the special-shaped portion 4, and lengths of the orthographic projections of the deformation adjustment layers 5 on the deposition surface C of the mask body 3 in a direction (i.e., the Z direction of FIG. 11) perpendicular to the protruding direction of the special-shaped portion 4 may be increasing gradually along the protruding direction of the special-shaped portion 4, which resulting that forces of different magnitudes can be applied to the special-shaped portion 4 in accordance with the distribution of deformation amount of the special-shaped portion 4.

The structure of each of the deformation adjustment layers 5 can be the same as that of the deformation adjustment layer 5 in each of the above embodiments. Since the structure of the deformation adjustment layer 5 has been described in detail in the above various embodiments, it will not be described herein.

It should be noted that, in this embodiment, the orthographic projection of each of the deformation adjustment layers 5 on the deposition surface C of the mask body 3 has a shape of an isosceles triangle, but the present disclosure is not limited thereto. In practical applications, the shape of each of the deformation adjustment layers 5 may be designed according to the distribution of deformation amount of the special-shaped portion 4, for example, an isosceles trapezoid. In addition, the position at which the deformation adjustment layer 5 is provided in a through-thickness direction of the mask body 3 can refer to FIGS. 4A, 5A through 5D.

Figure 12:
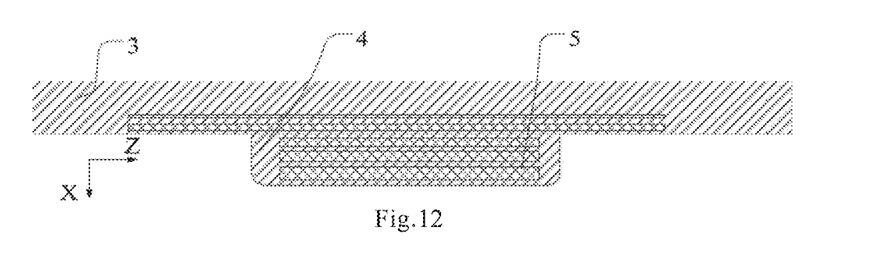
FIG. 12 is a transverse cross-sectional view of a part of a mask plate according to still another embodiment of the present disclosure.

Referring to FIG. 12, a mask plate provided by still another embodiment of the present disclosure is a variant based on the above various embodiments. Specifically, the number of the deformation adjustment layer 5 is plural; each of the plurality of deformation adjustment layers 5 extends in a direction perpendicular to the protruding direction of the special-shaped portion 4 (i.e., the X direction of FIG. 12), that is, the orthographic projection of each of the deformation adjustment layers 5 on the deposition surface C of the mask body 3 has a shape of a linear strip. The plurality of the deformation adjustment layers 5 are arranged to be spaced apart in the protruding direction (i.e., the X direction of FIG. 12) of the special-shaped portion 4, and the widths of the plurality of the deformation adjustment layers 5 in the protruding direction of the special-shaped portion 4 may be increasing gradually along the protruding direction of the special-shaped portion 4, resulting that forces of different magnitudes can be applied to the special-shaped portion 4 in accordance with the distribution of deformation amount of the special-shaped portion 4.

It should be noted that, in this embodiment, the shape of the orthographic projection of each of the deformation adjustment layers 5 on the deposition surface C of the mask body 3 is a linear strip shape, but the present disclosure is not limited thereto. In practical applications, each of the deformation adjustment layers 5 may also be of any other shape, such as an isosceles trapezoid or an isosceles triangle.

Figure 13A:
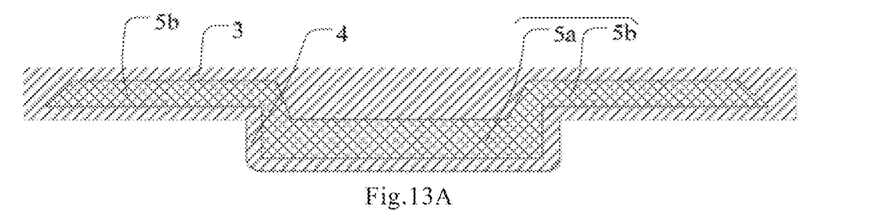
FIG. 13A is a transverse cross-sectional view of a part of a mask plate according to still another embodiment of the present disclosure.

Referring to FIG. 13A, a mask plate provided by still another embodiment of the present disclosure is a variant based on the above various embodiments. Specifically, the deformation adjustment layer 5 includes a first portion 5a and a second portion 5b which form an integrated structure or are separated from each other. An orthographic projection of the first portion 5a of the deformation adjustment layer 5 on the deposition surface C of the mask body 3 overlaps with the orthographic projection of the special-shaped portion 4 on the deposition surface C of the mask body 3, and an orthographic projection of the second portion 5b of the deformation adjustment layer 5 on the deposition surface C of the mask body 3 overlaps with an orthographic projection of the region nearby the common boundary of the special-shaped portion 4 and the mask body 3 on the deposition surface C of the mask body 3, so as to suppress the deformation of the special-shaped portion 4 as well as the region.

In the present embodiment, the orthographic projection of the first portion 5a on the deposition surface C of the mask body 3 has a shape of a rectangle. The orthographic projection of the second portion 5b on the deposition surface C of the mask body 3 has a shape of an isosceles trapezoid. However, the present disclosure is not limited thereto, and in practical applications, the first portion 5a and the second portion 5b may take other arbitrary shapes.

Figure 13B:
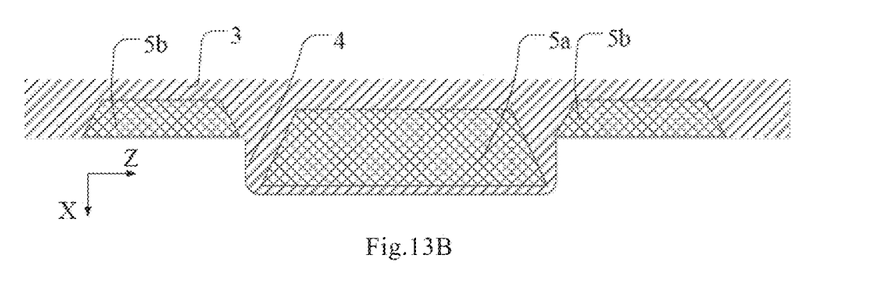
FIG. 13B is a transverse cross-sectional view of a part of another mask plate according to still another embodiment of the present disclosure.

In the present embodiment, the first portion 5a and the second portion 5b of the deformation adjustment layer 5 are formed as an integrated structure. However, the present disclosure is not limited thereto, and as shown in FIG. 13B, the first portion 5a and the second portion 5b of the deformation adjustment layer 5 may also be separated from each other.

It is to be understood that the position at which the deformation adjustment layer 5 is provided in the through-thickness direction of the mask body 3 may be refer to FIGS. 4A, 5A through 5D.

In summary, the mask plate provided by the present disclosure is provided with the deformation adjustment layer 5, and the orthographic projection of the deformation adjustment layer 5 on the deposition surface C of the mask body 3 at least partially overlaps with the orthographic projection of the special-shaped portion 4 on the deposition surface C of the mask body 3. Further, the thermal expansion coefficient of the deformation adjustment layer 5 is configured to be different from that of the special-shaped portion 4, therefore deformation of the special-shaped portion 4 can be suppressed, and deposition precision can be improved.

Figure 14:
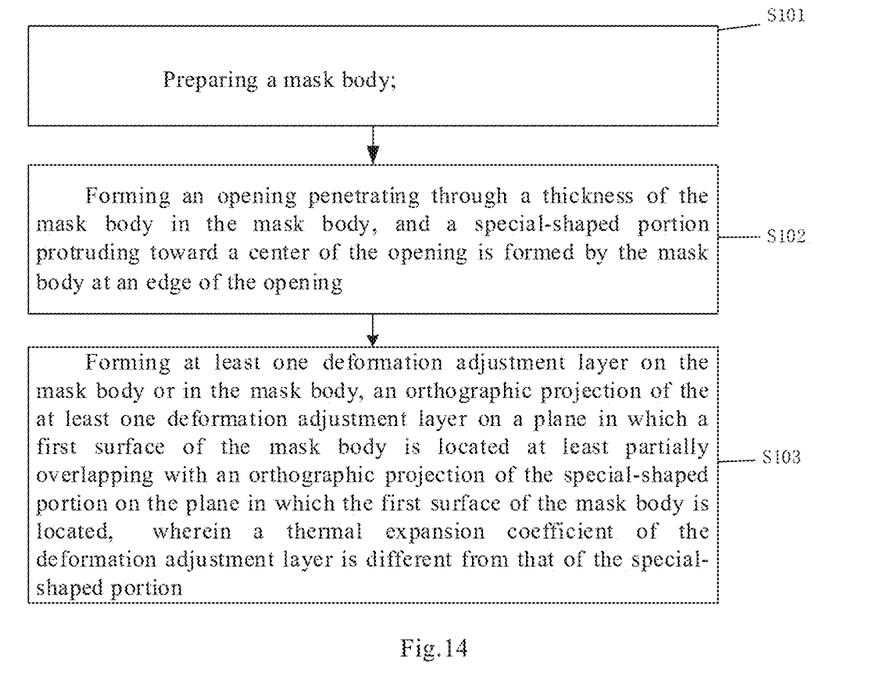
FIG. 14 is a flowchart of a manufacture method for a mask plate according to an embodiment of the present disclosure.

Referring to FIG. 14, the present disclosure also provides a manufacture method of a mask plate, the method including Step 101 to Step 104.

At step 101, preparing a mask body.

At step 102, forming an opening penetrating through a thickness of the mask body, such that a special-shaped portion, which protrudes toward a center of the opening and is provided at the edge of the opening, is formed by the mask body.

At step 103, forming at least one deformation adjustment layer on or in the mask body, an orthographic projection of the at least one deformation adjustment layer on a plane in which a first surface of the mask body is located at least partially overlaps with an orthographic projection of the special-shaped portion on the plane in which the first surface of the mask body is located, wherein, a thermal expansion coefficient of the deformation adjustment layer is different from that of the special-shaped portion, so as to suppress deformation of the special-shaped portion during processing.

It can be understood that the foregoing implementations are merely exemplary implementations used for describing the principle of the present disclosure, but the present disclosure is not limited thereto. Those of ordinary skill in the art may make various variations and modifications without departing from the spirit and essence of the present disclosure, and these variations and modifications shall fall into the protection scope of the present disclosure.

The invention claimed is:

1. A mask plate, comprising:
    a mask body, which is provided with an opening penetrating through a thickness of the mask body;
    a special-shaped portion configured to be disposed at an edge of the opening and protrude toward a center of the opening, and configured to be formed by the mask body; and
    at least one deformation adjustment layer disposed in the mask body, an orthographic projection of the at least one deformation adjustment layer on a plane in which a first surface of the mask body is located at least partially overlapping with an orthographic projection of the special-shaped portion on the plane in which the first surface of the mask body is located,
    wherein a thermal expansion coefficient of the deformation adjustment layer is different from that of the special-shaped portion.

2. The mask plate of claim 1, wherein the mask body further has a second surface opposite to the first surface, and the deformation adjustment layer is disposed close to the second surface of the mask body rather than the first surface of the mask body.

3. The mask plate of claim 2, wherein the first surface of the mask body is a surface of the mask body on which a deposited film layer is deposited,
    a film stress of the deposited film layer is represented as a tensile stress, and the thermal expansion coefficient of the deformation adjustment layer is set to be greater than that of the special-shaped portion, or
    the film stress of the deposited film layer is represented as a compressive stress, and the thermal expansion coefficient of the deformation adjustment layer is set to be smaller than that of the special-shaped portion.

4. The mask plate of claim 2, wherein the first surface of the mask body is a surface opposite to a surface of the mask body on which a deposited film layer is deposited,
    in a case where a film stress of the deposited film layer is represented as a compressive stress, the thermal expansion coefficient of the deformation adjustment layer is set to be greater than that of the special-shaped portion, and
    in a case where the film stress of the deposited film material is represented as a tensile stress, the thermal expansion coefficient of the deformation adjustment layer is set to be smaller than that of the special-shaped portion.

5. The mask plate of claim 2, wherein the deformation adjustment layer is disposed in the special-shaped portion, a first surface of the deformation adjustment layer is coplanar with the first surface of the mask body, and a second surface of the deformation adjustment layer opposite to the first surface thereof is disposed between the first surface of the mask body and the second surface of the mask body.

6. The mask plate of claim 2, wherein the deformation adjustment layer is disposed in the special-shaped portion, a first surface of the deformation adjustment layer is disposed between the first surface of the mask body and the second surface of the mask body, and a second surface of the deformation adjustment layer protrudes from the second surface of the mask body.

7. The mask plate of claim 2, wherein the deformation adjustment layer is completely disposed in the special-shaped portion, a first surface of the deformation adjustment layer and a second surface of the deformation adjustment layer are not exposed from the mask body, and the deformation adjustment is disposed close to the first surface of the mask body rather than the second surface of the mask body.

8. The mask plate of claim 2, wherein the deformation adjustment layer is completely disposed in the special-shaped portion, a first surface of the deformation adjustment layer and a second surface of the deformation adjustment layer are not exposed from the mask body, and the deformation adjustment is disposed close to the second surface of the mask body rather than the first surface of the mask body.

9. The mask plate of claim 1, wherein the deformation adjustment layer has a uniform thickness.

10. The mask plate of claim 1, wherein the deformation adjustment layer has a varying thickness and thicknesses of parts of the deformation adjustment layer are associated with deformation amounts of corresponding parts of the special-shaped portion.

11. The mask plate of claim 1, wherein a length of the orthographic projection of the deformation adjustment layer on the first surface of the mask body in a direction perpendicular to a protruding direction of the special-shaped portion is gradually increasing along the protruding direction of the special-shaped portion.

12. The mask plate of claim 11, wherein the orthographic projection of the deformation adjustment layer on the first surface of the mask body has a shape of an isosceles triangle or an isosceles trapezoid.

13. The mask plate of claim 1, wherein the number of the deformation adjustment layer is plural, the plurality of the deformation adjustment layers are spaced apart in a direction perpendicular to a protruding direction of the special-shaped portion.

14. The mask plate of claim 2, wherein the number of the deformation adjustment layer is plural, the plurality of the deformation adjustment layers are spaced apart in a direction perpendicular to a protruding direction of the special-shaped portion.

15. The mask plate of claim 3, wherein the number of the deformation adjustment layer is plural, the plurality of the deformation adjustment layers are spaced apart in a direction perpendicular to a protruding direction of the special-shaped portion.

16. The mask plate of claim 4, wherein the number of the deformation adjustment layer is plural, the plurality of the deformation adjustment layers are spaced apart in a direction perpendicular to a protruding direction of the special-shaped portion.

17. The mask plate of claim 1, wherein the number of the deformation adjustment layer is plural, an orthographic projection of each of the plurality of deformation adjustment layers on a plane in which the first surface of the mask body is located has a shape of a linear strip extending in a direction perpendicular to a protruding direction of the special-shaped portion, the plurality of deformation adjustment layers are spaced apart in the protruding direction of the special-shaped portion, and widths of the plurality of the deformation adjustment layers in the protruding direction of the special-shaped portion are gradually increasing along the protruding direction of the special-shaped portion.

18. The mask plate of claim 1, wherein, the orthographic projection of the deformation adjustment layer on the plane in which the first surface of the mask body is located also covers a region nearby a common boundary of the special-shaped portion and the mask body.

19. The mask plate of claim 18, wherein the deformation adjustment layer comprises a first portion and a second portion that are separated from each other,
an orthographic projection of the first portion of the deformation adjustment layer on the first surface of the mask body at least partially overlaps with the orthographic projection of the special-shaped portion on the first surface of the mask body, and
an orthographic projection of the second portion of the deformation adjustment layer on the first surface of the mask body overlaps the region nearby the common boundary of the special-shaped portion and the mask body.

20. A manufacture method of a mask plate, wherein the mask plate is the mask plate of claim 1, the method comprising:
preparing a mask body;
forming an opening penetrating through a thickness of the mask body in the mask body, and a special-shaped portion protruding toward a center of the opening is formed by the mask body at an edge of the opening;
forming at least one deformation adjustment layer in the mask body, an orthographic projection of the at least one deformation adjustment layer on a plane in which a first surface of the mask body is located at least partially overlapping with an orthographic projection of the special-shaped portion on the plane in which the first surface of the mask body is located,
wherein a thermal expansion coefficient of the deformation adjustment layer is different from that of the special-shaped portion.

* * * * *